(12) United States Patent
Degawa et al.

(10) Patent No.: US 9,500,666 B2
(45) Date of Patent: Nov. 22, 2016

(54) MICRO ELECTRO MECHANICAL SYSTEM

(71) Applicant: Hitachi, Ltd, Tokyo (JP)

(72) Inventors: Munenori Degawa, Kokubunji (JP); Heewon Jeong, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 269 days.

(21) Appl. No.: 14/190,968

(22) Filed: Feb. 26, 2014

(65) Prior Publication Data

US 2014/0174181 A1 Jun. 26, 2014

Related U.S. Application Data

(63) Continuation of application No. 13/058,862, filed as application No. PCT/JP2009/063855 on Aug. 5, 2009, now Pat. No. 8,683,864.

(30) Foreign Application Priority Data

Aug. 18, 2008 (JP) .................................. 2008-209786

(51) Int. Cl.
*G01P 15/125* (2006.01)
*G01C 19/56* (2012.01)
(Continued)

(52) U.S. Cl.
CPC ........... *G01P 1/003* (2013.01); *G01C 19/5712* (2013.01); *G01C 19/5733* (2013.01);
(Continued)

(58) Field of Classification Search
CPC . G01C 19/5719; G01C 19/56; G01P 15/125; G01P 15/0802; G01P 15/131; G01P 15/097
USPC ............................ 73/514.32, 504.12, 504.14
See application file for complete search history.

(56) References Cited

U.S. PATENT DOCUMENTS

| | | |
|---|---|---|
| 5,415,043 A | 5/1995 | Zabler et al. |
| 5,734,105 A | 3/1998 | Mizukoshi |

(Continued)

FOREIGN PATENT DOCUMENTS

| | | |
|---|---|---|
| CN | 1981197 A | 6/2007 |
| EP | 1 950 528 A2 | 1/2008 |

(Continued)

OTHER PUBLICATIONS

Extended European Search Report (including search opinion) issued in European Patent Application No. 09808178.9, Sep. 25, 2012.

(Continued)

*Primary Examiner* — Helen Kwok
(74) *Attorney, Agent, or Firm* — Miles & Stockbridge P.C.

(57) ABSTRACT

In order to provide a technology capable of suppressing degradation of measurement accuracy due to fluctuation of detection sensitivity of an MEMS by suppressing fluctuation in natural frequency of the MEMS caused by a stress, first, fixed portions 3a to 3d are displaced outward in a y-direction of a semiconductor substrate 2 by deformation of the semiconductor substrate 2. Since a movable body 5 is disposed in a state of floating above the semiconductor substrate 2, it is not affected and displaced by the deformation of the semiconductor substrate 2. Therefore, a tensile stress $(+\sigma_1)$ occurs in the beam 4a and a compressive stress $(-\sigma_2)$ occurs in the beam 4b. At this time, in terms of a spring system made by combining the beam 4a and the beam 4b, increase in spring constant due to the tensile stress acting on the beam 4a and decrease in spring constant due to the compressive stress acting on the beam 4b are offset against each other.

14 Claims, 9 Drawing Sheets

(51) Int. Cl.
  *G01P 1/00* (2006.01)
  *G01C 19/5733* (2012.01)
  *G01P 1/02* (2006.01)
  *G01P 15/08* (2006.01)
  *G01C 19/5712* (2012.01)

(52) U.S. Cl.
  CPC ............ *G01P1/023* (2013.01); *G01P 15/0802* (2013.01); *G01P 15/125* (2013.01); *G01P 2015/0814* (2013.01)

(56) References Cited

U.S. PATENT DOCUMENTS

| | | | | |
|---|---|---|---|---|
| 5,945,599 | A * | 8/1999 | Fujiyoshi | G01C 19/5719 73/504.12 |
| 5,987,989 | A * | 11/1999 | Yamamoto | B81B 7/0006 361/280 |
| 6,032,532 | A * | 3/2000 | Brun | G01P 15/0802 73/514.32 |
| 6,070,463 | A * | 6/2000 | Moriya | G01C 19/5719 73/504.02 |
| 6,122,961 | A | 9/2000 | Geen et al. | |
| 6,128,953 | A * | 10/2000 | Mizukoshi | G01C 19/5719 73/504.02 |
| 6,240,780 | B1 * | 6/2001 | Negoro | G01C 19/5719 73/504.12 |
| 6,318,177 | B2 | 11/2001 | Buchan et al. | |
| 6,327,907 | B1 | 12/2001 | Park | |
| 6,456,801 | B1 * | 9/2002 | Sakurai | G03G 15/6514 399/16 |
| 6,516,666 | B1 * | 2/2003 | Li | G01C 19/5719 73/504.02 |
| 6,536,280 | B1 * | 3/2003 | Carley | G01P 15/125 361/283.1 |
| 6,539,803 | B2 * | 4/2003 | Mochida | G01C 19/5719 73/504.12 |
| 6,546,801 | B2 | 4/2003 | Orsier et al. | |
| 6,571,630 | B1 | 6/2003 | Weinberg et al. | |
| 6,631,643 | B2 * | 10/2003 | Malvern | G01P 15/0802 73/514.32 |
| 6,843,127 | B1 * | 1/2005 | Chiou | G01C 19/5719 73/504.12 |
| 6,915,693 | B2 * | 7/2005 | Kim | G01C 19/5762 73/504.12 |
| 6,964,195 | B2 * | 11/2005 | Hobbs | G01C 19/5719 73/504.12 |
| 7,024,934 | B2 | 4/2006 | Yu | |
| 7,444,873 | B2 * | 11/2008 | Robert | B81B 3/007 438/50 |
| 7,562,573 | B2 * | 7/2009 | Yazdi | B81C 1/00253 361/280 |
| 7,631,559 | B2 | 12/2009 | Mochida | |
| 8,342,022 | B2 * | 1/2013 | Schmid | G01C 19/5747 73/504.12 |
| 8,371,167 | B2 * | 2/2013 | Wang | G01P 15/0802 73/514.32 |
| 8,413,509 | B2 * | 4/2013 | Geisberger | G01P 15/125 73/514.32 |
| 2004/0255672 | A1 | 12/2004 | Knowles et al. | |
| 2005/0039530 | A1 * | 2/2005 | Schellin | B81C 99/006 73/514.32 |
| 2005/0204816 | A1 | 9/2005 | Tokunaga | |
| 2006/0174704 | A1 | 8/2006 | Tsubaki | |
| 2008/0066546 | A1 | 3/2008 | Katsumata | |
| 2009/0056444 | A1 | 3/2009 | Jeong et al. | |

FOREIGN PATENT DOCUMENTS

| | | |
|---|---|---|
| EP | 1 868 000 A1 | 9/2008 |
| JP | H0923015 A | 1/1997 |
| JP | 09-292409 A | 11/1997 |
| JP | 11-190635 A | 7/1999 |
| JP | 2000-292174 A | 10/2000 |
| JP | 2000-346649 A | 12/2000 |
| JP | 2001-515201 A | 9/2001 |
| JP | 2002174640 A | 6/2002 |
| JP | 2002540406 A | 11/2002 |
| JP | 3669713 B2 | 4/2005 |
| JP | 2005-265795 A | 9/2005 |
| JP | 2006-105698 A | 4/2006 |
| JP | 2006220453 A | 8/2006 |
| JP | 2008-070230 A | 3/2008 |
| JP | 2008-076153 A | 4/2008 |

OTHER PUBLICATIONS

Office Action for related Japanese Application No. 2014-188939, mailed Jul. 28, 2015.

* cited by examiner

MICRO ELECTRO MECHANICAL SYSTEM

TECHNICAL FIELD

The present invention relates to micro electro mechanical systems (called "MEMS"), and more particularly to a technology effectively applied to MEMS whose performance is affected by natural frequency of a structural body, for example, an inertial sensor including an acceleration sensor or an angular velocity sensor, a filter and an oscillator for clock generation, which are used to measure a kinetic state of a moving body such as a vehicle, an airplane, a robot, a mobile phone or a video camera.

BACKGROUND ART

In recent years, sensors using the MEMS have been widely used for the purpose of image stabilization of a digital camera and attitude control of a vehicle or a robot.

Generally, this type of MEMS is formed by processing a semiconductor substrate such as a silicon substrate by using photolithography technology and etching technology, and it is provided with a semiconductor substrate, a movable body that is displaced in a predetermined direction and a plurality of beams joining the movable body and the semiconductor substrate. The MEMS is for detecting a physical quantity such as an angular velocity or an acceleration based on a displacement of the movable body.

Japanese patent No. 3669713 (Patent Document 1) describes an example of the angular velocity sensor. This angular velocity sensor is provided with oscillation generating means for oscillating an oscillator (movable body) around the oscillator and angular velocity detecting means for detecting an amount of displacement of the oscillator in a direction perpendicular to an oscillation direction as an angular velocity. At this time, the oscillator is fixed to a semiconductor substrate via a beam functioning as a spring, and this structure allows the oscillator to oscillate.

Japanese patent Application laid-open Publication No. 09-292409 (Patent Document 2) describes an example of the acceleration sensor. This acceleration sensor has a structure in which the movable body is fixed to the semiconductor substrate via a beam functioning as a spring in order to displace the movable body unidirectionally and the movable body is displaced in accordance with an applied acceleration. Also, acceleration detecting means for detecting an amount of displacement of the movable body as an acceleration is provided.

The angular velocity sensor in Patent Document 1 and the acceleration sensor in Patent Document 2 described above are called "sensor element". That is, a semiconductor chip on which MEMS such as an angular velocity sensor and an acceleration sensor are formed is called "sensor element". In an actual sensor, generally, the sensor element is mounted on a package body by using an adhesive agent, and it is necessary to connect the sensor element and an electrode formed in the package to each other via a wire so that a signal can be taken out of the electrode formed in the package.

PRIOR ART DOCUMENTS

Patent Documents

Patent Document 1: Japanese patent No. 3669713
Patent Document 2: Japanese patent Application laid-open Publication No. 09-292409

SUMMARY OF THE INVENTION

Problems to be Solved by the Invention

In the angular velocity sensor described above, when three axes perpendicular to each other are represented as x-axis, y-axis and z-axis, respectively, the oscillator is first oscillated at a frequency f and an amplitude Xe by the oscillation generating means in an x-axis direction parallel to the semiconductor substrate. At this time, a relationship between a displacement x in the x-axis direction of the oscillator and a velocity v thereof is represented by Expressions 1.

$$x = xe\,\sin(2\pi ft)$$
$$v = 2\pi f Xe\,\cos(2\pi ft) \quad (1)$$

Here, the symbol f represents a frequency, the symbol Xe represents an amplitude, and the symbol t represents a time period.

In this state, by applying an angular velocity $\Omega$ around the z-axis externally, a Coriolis force Fc represented by Expression (2) is generated, and the Coriolis force Fc displaces the oscillator in a y-axis direction perpendicular to the x-axis. Then, the angular velocity detecting means detects the displacement of the oscillator in the y-axis direction due to the Coriolis force Fc as a change in, for example, electrostatic capacitance or resistance, thereby detecting the angular velocity.

$$Fc = 2\,m\Omega v \quad (2)$$

Here, the symbol m represents a mass of the oscillator, the symbol $\Omega$ represents an angular velocity, and the symbol v represents a velocity in the x-axis direction of the oscillator.

Further, the angular velocity sensor can detect a stable displacement in the y-axis direction when the frequency f at the time when the oscillator oscillates in the x-axis direction is always in a resonant state, namely, when the oscillator oscillates at its natural frequency $f_0$. Generally, the natural frequency $f_0$ of the oscillator is defined by Expression (3).

$$f_0 = 1/(2\pi) \times \sqrt{(k/m)} \quad (3)$$

Here, the symbol k represents a spring constant of the beam and the symbol m represents a mass of the oscillator.

When definition is made with an angular velocity detection sensitivity $S(\Omega) = Fc/\Omega$, the angular velocity detection sensitivity $S(\Omega)$ is obtained as represented by Expression (4) from Expression (1), Expression (2) and Expression (3). Therefore, it is found that the angular velocity detection sensitivity $S(\Omega)$ is proportional to the natural frequency $f_0$, the mass m of the oscillator and the amplitude Xe thereof.

$$S(\Omega) = Fc/\Omega \propto f_0,\,m,\,Xe \quad (4)$$

Next, in the acceleration sensor described above, a force F1 generated in the movable body when an acceleration a1 is applied to the acceleration sensor is represented by Expression (5).

$$F1 = m1 \times a1 = k1 \times x1 \quad (5)$$

Here, the symbol m1 represents a mass of the movable body, the symbol a1 represents an acceleration applied to the movable body, the symbol k1 represents a spring constant of the beam, and the symbol x1 represents an amount of displacement of the movable body.

Then, by defining an acceleration detection sensitivity S1 = x1/a1 from the Expression (5) and relating this to Expression (3) that is a definitional expression of a natural frequency, it is found that the acceleration detection sensitivity S1 is determined by a natural frequency f1 of the movable body as represented by Expression (6).

$$S1 = x1/a1 = m1/k1 = 1/(2\pi f_0)^2 \qquad (6)$$

However, when the sensor element is adhered to the package body, stress occurs from the adhesive agent to the sensor element in general due to volume change caused by the setting of the adhesive agent There is a problem that the natural frequency $f_0$ of the sensor element (movable body, oscillator) changes due to this stress occurring in the sensor element. Also, when ambient temperature of the sensor element changes, there is a problem that stress occurs due to a difference in coefficient of thermal expansion between materials constituting the sensor element, and thus the natural frequency $f_0$ of the sensor element (movable body, oscillator) changes. The fluctuation in the natural frequency $f_0$ like this causes the fluctuation in detection sensitivity of the angular velocity sensor and the acceleration sensor, which results in reduction in measurement accuracy of the angular velocity sensor and the acceleration sensor.

An object of the present invention is to provide a technology capable of suppressing the fluctuation in natural frequency of the MEMS due to stress, thereby suppressing the degradation of the measurement accuracy due to the fluctuation in the detection sensitivity of the MEMS.

The above and other objects and novel characteristics of the present invention will be apparent from the description of the present specification and the accompanying drawings.

Means for Solving the Problems

The following is a brief description of an outline of the typical invention disclosed in the present application.

A micro electro mechanical system according to a representative embodiment of the present invention relates to a micro electro mechanical system having, formed on a first semiconductor chip, (a) a first fixed portion, (b) an elastically deformable first beam, one end of which is connected to the first fixed portion, (c) a second fixed portion, (d) an elastically deformable second beam, one end of which is connected to the second fixed portion, and (e) a displaceable movable body connected to the other end of the first beam and the other end of the second beam. At this time, when the first fixed portion and the second fixed portion are displaced in the same direction by a stress occurring in the first semiconductor chip, a spring constant of the first beam is increased as compared with that when the first fixed portion is not displaced, and a spring constant of the second beam is decreased as compared with that when the second fixed portion is not displaced.

Effects of the Invention

The effects obtained by typical embodiments of the invention disclosed in the present application will be briefly described below.

Since the degradation of the measurement accuracy of the MEMS can be suppressed, the improvement in reliability of the MEMS can be achieved.

BRIEF DESCRIPTIONS OF THE DRAWINGS

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, components having the same function are denoted by the same reference symbols throughout the drawings for describing the embodiments, and the repetitive description thereof is omitted. Note that, in some drawings used in the embodiments, hatching is used even in a plan view so as to make the drawings easy to see.

First Embodiment

Figure 1:
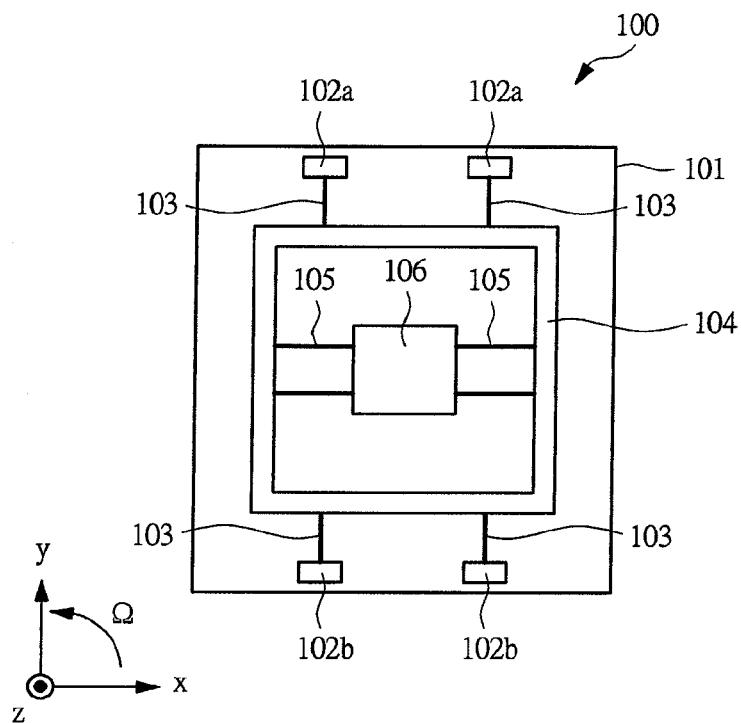
FIG. 1 is a plan view showing a structure of a sensor element of an angular velocity sensor examined by the inventors of the present invention.

First, a mechanism of change in natural frequency will be described with taking an angular velocity sensor examined by the inventors of the present invention as an example. FIG. 1 is a plan view showing a structure of a sensor element 100 of the angular velocity sensor examined by the inventors of the present invention. As shown in FIG. 1, fixed portions 102a and 102b are formed on a rectangular semiconductor substrate 1, and an oscillator 104 is connected to the fixed portions 102a and 102b via beams 103. The beams 103 are formed to be elastically deformable, and the oscillator 104 connected to the beams 103 is designed to be capable of oscillating in an x-axis direction. The oscillator 104 forms an outer frame, and an oscillator 106 is formed inside the outer frame via beams 105. The oscillator 106 is formed to be displaceable in a y-axis direction.

The sensor element of the angular velocity sensor examined by the inventors of the present invention has the structure as described above, and an operation thereof will be briefly described below. First, the oscillator 104 shown in FIG. 1 is oscillated in the x-axis direction. At this time, the oscillator 106 disposed inside the oscillator 104 via the beams 105 also oscillates in the x-axis direction. If an angular velocity acts about an x-axis in this state, a Coriolis force displaces the oscillator 106 disposed inside the oscillator 104 in the y-axis direction. Since the displacement of the oscillator 106 in the y-axis direction is proportional to the magnitude of the angular velocity occurring about the z-axis, an angular velocity about the z-axis can be detected by detecting a displacement of the oscillator 106 in the y-axis direction. For example, since the displacement of the oscillator 106 in the y-axis direction changes electrostatic capacitance formed by a fixed electrode and the oscillator 106, an amount of the displacement of the oscillator 106 in the y-axis direction can be detected by converting the change in electrostatic capacitance into a voltage signal. In other words, by detecting the displacement of the oscillator 106 in the y-axis direction as a change in electrostatic capacitance, the angular velocity occurring about the z-axis can be measured.

Figure 2:
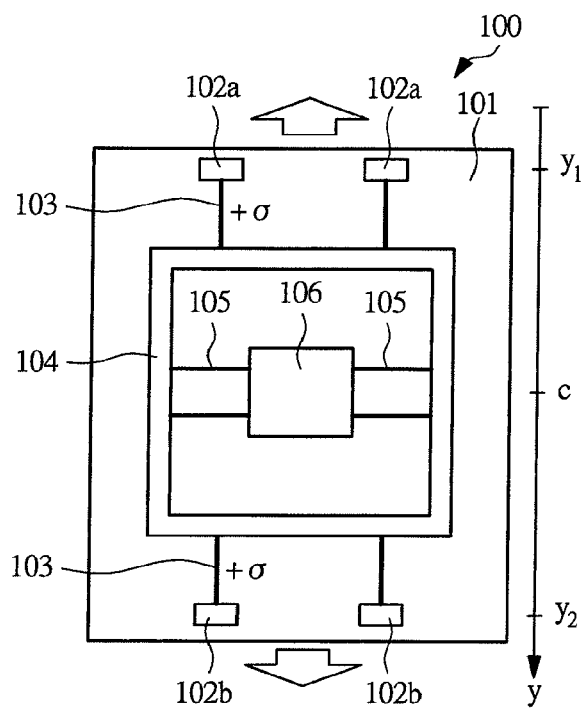
FIG. 2 is a diagram showing a state where a tensile stress acts on the sensor element of the angular velocity sensor examined by the inventors of the present invention.

The sensor element 100 as described above is mounted in a package to form an angular velocity sensor. At this time, the sensor element 100 is adhered to the package with an adhesive agent, and stress occurs in the sensor element 100 due to volume deformation caused by the setting of the adhesive agent. For example, assuming that a tensile stress in a y-direction occurs in the semiconductor substrate 101 constituting the sensor element 100 as shown in FIG. 2, the semiconductor substrate 101 deforms so as to extend in the y-direction. At this time, since the fixed portions 102a and 102b are fixed to the semiconductor substrate 101, when the semiconductor substrate 101 extends in the y-direction, the fixed portions 102a and 102b also displace along with the extension. On the other hand, since the oscillator 104 is not fixed to the semiconductor substrate 101, even when a tensile stress occurs in the semiconductor substrate 101, the oscillator 104 is not displaced. Therefore, the tensile stress acts on the beams 103 connecting the fixed portions 102a and 102b and the oscillator 104 to each other. More specifically, since the fixed portions 102a and 102b connected to one ends of the beams 103 are displaced while the oscillator 104 connected to the other ends of the beams 103 are not displaced, the beams 103 are pulled along with the displacement of the fixed portions 102a and 102b. As a result, a tensile stress occurs in the beams 103. When the tensile stress acts on the beams 103, a spring constant of the beams 103 increases, so that the natural frequency of the sensor element 100 also increases.

Figure 3:
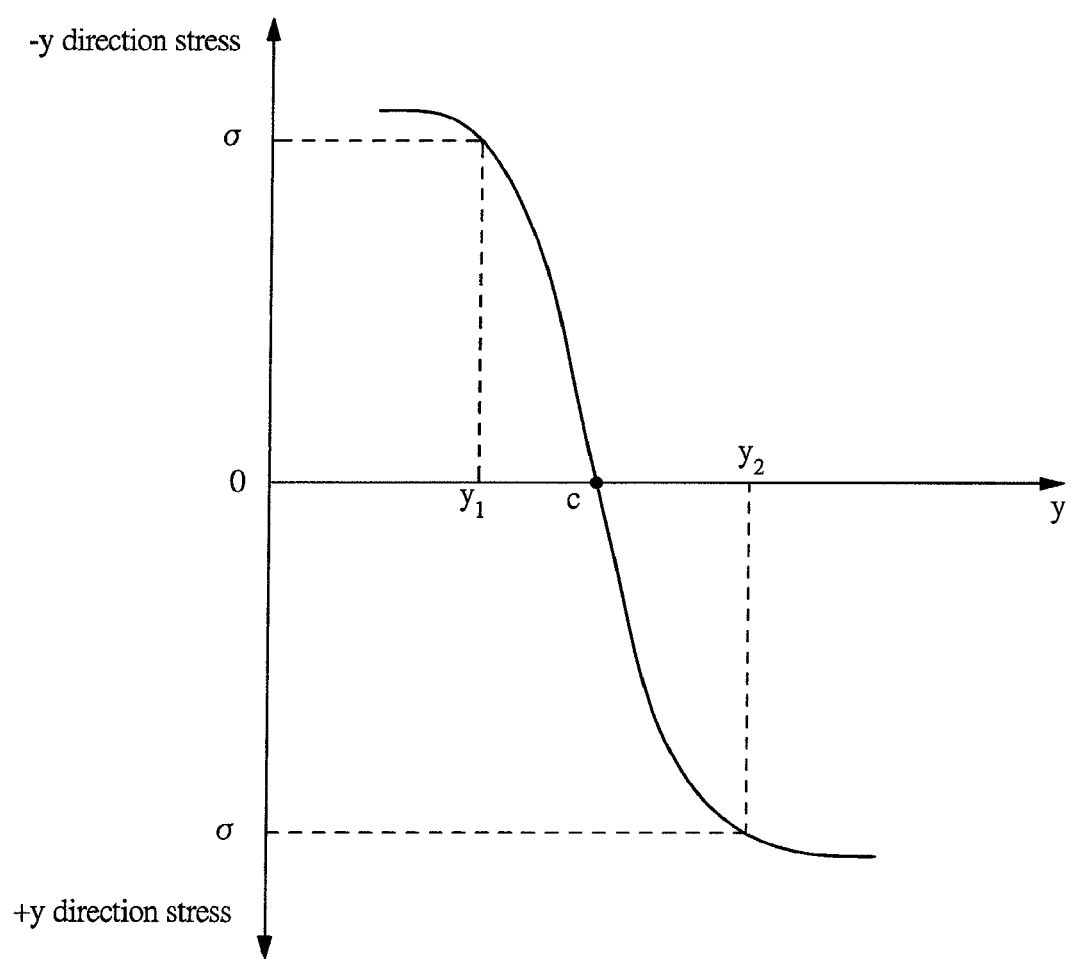
FIG. 3 is a graph showing positions in a y-direction of a semiconductor substrate and stresses acting on the respective positions in a technology examined by the inventors of the present invention.

Here, the oscillator 104 is connected to the fixed portions 102a and the fixed portions 102b, and in the case where a tensile stress acts in the y-direction of the semiconductor substrate 101, a tensile stress acts on both the beams 103 connecting the fixed portions 102a and the oscillator 104 and the beams 103 connecting the fixed portions 102b and the oscillator 104. This will be described with reference to FIG. 3. FIG. 3 is a graph showing positions in the y-direction of the semiconductor substrate 101 and stresses acting on the respective positions. In FIG. 3, a horizontal axis represents a position in the y-direction, and a vertical axis represents stress. It is found that, in the case where a tensile stress acts on the semiconductor substrate 101, a direction in which the stress acts is reversed at the central position (C) in the y-direction. For example, it is found that a stress σ acts in a −y direction at a point $y_1$ where the fixed portion 102a is positioned while the stress σ acts in a +y direction at a point $y_2$ where the fixed portion 102b is positioned. Therefore, it is found that, when a tensile stress acts on the semiconductor substrate 101, the stress acts to displace both the fixed portion 102a and the fixed portion 102b outward. On the other hand, as shown in FIG. 2, since the oscillator 104 is disposed between the fixed portions 102a and the fixed portions 102b in the y-direction and disposed so as to float above the semiconductor substrate 101, it is not displaced. From the foregoing, when a tensile stress acts on the semiconductor substrate 101, both the fixed portions 102a and the fixed portions 102b are displaced away from the oscillator 104. As a result, the tensile stress acts on both the beams 103 disposed between the fixed portions 102a and the oscillator 104 and the beams 103 disposed between the fixed portions 102b and the oscillator 104. Therefore, the tensile stress acts on all of the beams 103 connected to the oscillator 104, and when viewed as the whole of the sensor element 100, the spring constant of the beams 103 increases, so that the natural frequency of the sensor element 100 is changed to increase.

It goes without saying that, since the adhesive agent and the semiconductor substrate 101 are normally different in coefficient of thermal expansion from each other, the stress applied to the semiconductor substrate 101 changes along with the change in ambient temperature. Therefore, the change in ambient temperature also constitutes a factor for the fluctuation of the natural frequency of the sensor element. Further, the temporal change in mechanical constant of the adhesive agent also constitutes a factor for the fluctuation of the natural frequency.

In particular, the sensor element is often molded with a plastic resin for cost reduction in these days. As the plastic resin, normally, a thermosetting resin is often used for the convenience of a forming process thereof, and the resin significantly changes its volume to generate a distortion at the time of molding, and therefore the fluctuation in the natural frequency of the sensor element appears more prominently.

Regarding the fluctuation of the natural frequency described above, the factors due to the adhesion of the sensor element 100 and the package have been described, but there is also a factor for the fluctuation of the natural frequency caused by the sensor element 100 alone.

A SOI (Silicon On Insulator) substrate frequently used for the manufacture of the sensor element 100 is made up of a substrate layer, an embedded insulating layer formed on the substrate layer and a silicon layer formed on the embedded insulating layer. In the case where the sensor element 100 is formed by using this SOI substrate, the fixed portions 102a and 102b are formed by processing the silicon layer, and the silicon layer constituting the fixed portions 102a and 102b is fixed to the substrate layer via the embedded insulating layer. On the other hand, the beams 103 and the oscillator 104 are also formed by processing the silicon layer, but the embedded insulating layer positioned below the silicon layer constituting the beams 103 and the oscillator 104 is removed so that the beams 103 and the oscillator 104 can move and are in a floating state above the substrate layer.

In the SOI substrate with the structure as described above, the substrate layer and the silicon layer are made of silicon, and the embedded insulating layer is made of a silicon oxide film. Since the silicon and the silicon oxide film are different in coefficient of thermal expansion from each other, stress is applied from the embedded insulating layer to the silicon layer when ambient temperature changes. Therefore, the fixed portions 102a and 102b change their positions due to the stress applied from the embedded insulating layer. On the other hand, the oscillator 104 does not deform because it floats above the substrate layer. As a result, the beams 103 connecting the oscillator 104 and the fixed portions 102a and 102b to each other are subjected to a tensile stress or a compressive stress. Therefore, the spring constant of the beams 103 changes, and the natural frequency of the sensor element 100 fluctuates.

As described above, it is found that the natural frequency fluctuates due to the stress caused by the adhesion of the sensor element 100 and the package or the structure of the sensor element 100 alone. The fluctuation in natural frequency of the sensor element 100 causes a fluctuation in detection sensitivity of an angular velocity sensor or an acceleration sensor, and therefore the problems of degradation of measurement accuracy and reduction in reliability occur.

Thus, in the first embodiment, a structure that suppresses the fluctuation in natural frequency of the sensor element is proposed. The MEMS in the first embodiment will be described below with reference to the drawings. In the first embodiment, an acceleration sensor is described as an example of the MEMS.

Figure 4:
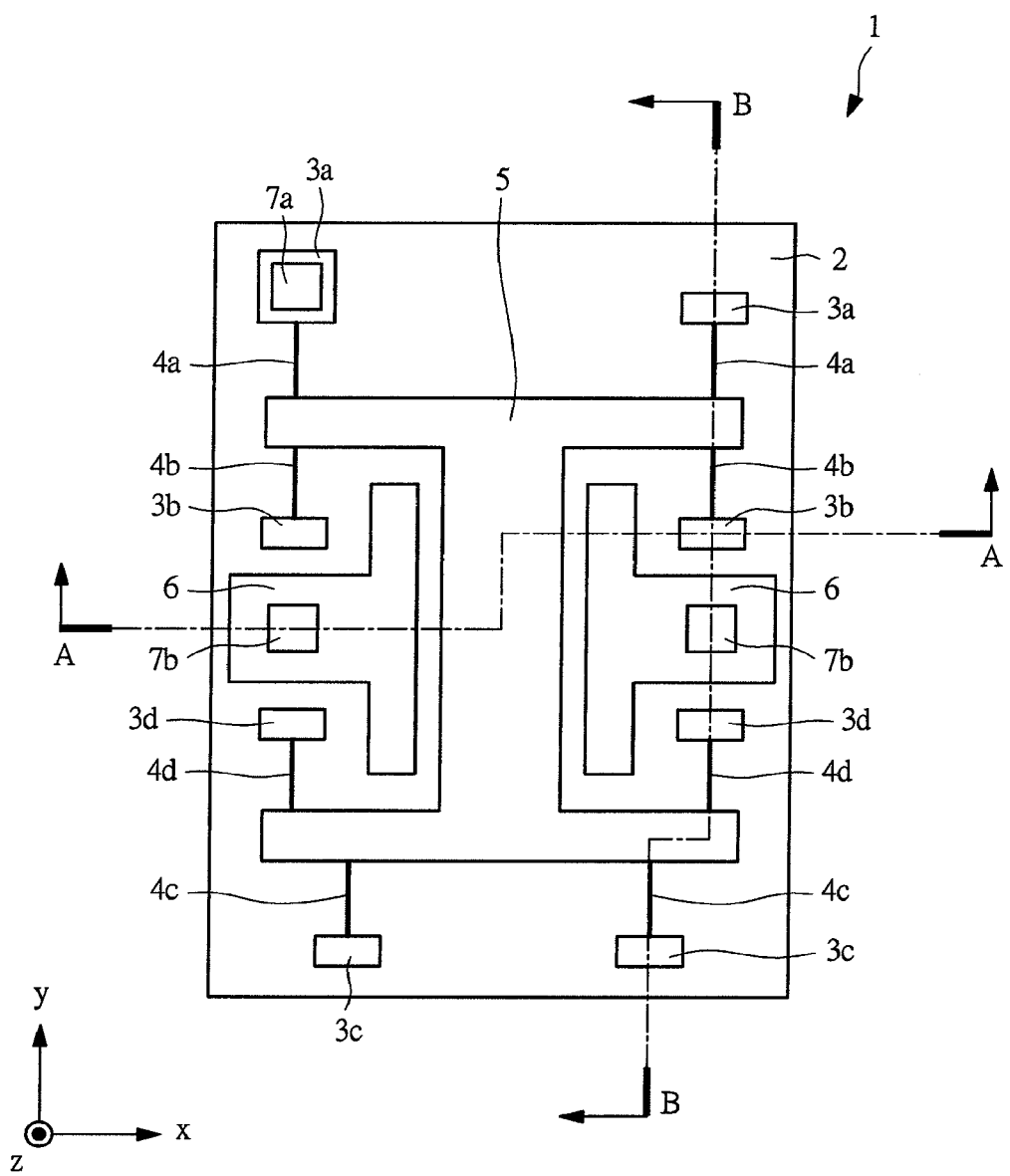
FIG. 4 is a plan view showing a structure of a sensor element of an acceleration sensor according to the first embodiment of the present invention.

FIG. 4 is a plan view showing a sensor element of the acceleration sensor in the first embodiment. As shown in FIG. 4, a sensor element (first semiconductor chip) 1 of the acceleration sensor has a rectangular semiconductor substrate 2, and fixed portions 3a, 3b, 3c and 3d and a movable body 5 are formed on the semiconductor substrate 2. While the fixed portions 3a, 3b, 3c and 3d are fixed to the semiconductor substrate 2, the movable body 5 is formed to be displaceable. Specifically, the fixed portions 3a and the movable body 5 are connected to each other by elastically-deformable beams 4a, and similarly the fixed portions 3b and the movable body 5 are connected to each other by elastically-deformable beams 4b. Further, the fixed portions 3c and the movable body 5 are connected to each other by elastically-deformable beams 4c, and similarly the fixed portions 3d and the movable body 5 are connected to each other by elastically-deformable beams 4d. More specifically, the movable body 5 is connected to the fixed portions 3a to 3d via the beams 4a to 4d, respectively. The movable body 5 thus formed is displaceable in an x-direction.

Further, fixed electrodes 6 are formed on the semiconductor substrate 2, and the fixed electrodes 6 and the movable body 5 constitute electrostatic capacitance elements. More specifically, the fixed electrodes 6 and the movable body 5 are made of an electrically conductive material, and the fixed electrodes 6 and the movable body 5 constitute a pair of electrodes. Also, pads 7a and 7b for transmitting and receiving signals with an external circuit are formed on the fixed portion 3a and the fixed electrodes 6, respectively.

Figure 5:
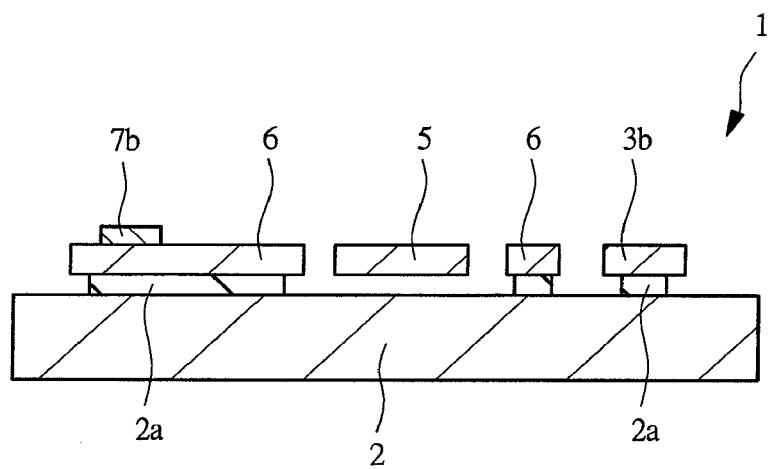
FIG. 5 is a cross-sectional view taken along the line A-A in FIG. 4.

FIG. 5 is a cross-sectional view taken along the line A-A in FIG. 4. As shown in FIG. 5, the sensor element 1 is formed by, for example, processing an SOI substrate by the photolithography technology and DRIE (Deep Reactive Ion Etching) technology. The SOI substrate is made up of a semiconductor substrate (substrate layer) 2 made of monocrystalline silicon, an embedded insulating layer (BOX layer) 2a made of a silicon oxide film and a silicon layer (active layer) made of monocrystalline silicon and formed on the embedded insulating layer 2a. Specifically, as shown in FIG. 5, the fixed electrodes 6, the movable body 5, and the fixed portion 3b are formed by processing the silicon layer. At this time, the fixed electrodes 6 and the fixed portion 3b are fixed to the semiconductor substrate 2 via the embedded insulating layer 2a. Further, the pad 7b is formed on the fixed electrode 6. On the other hand, the embedded insulating layer 2a positioned below the movable body 5 formed by processing the silicon layer is removed so that the movable body 5 is disposed to float above the semiconductor substrate 2, and thus the movable body 5 is formed to be movable.

Figure 6:
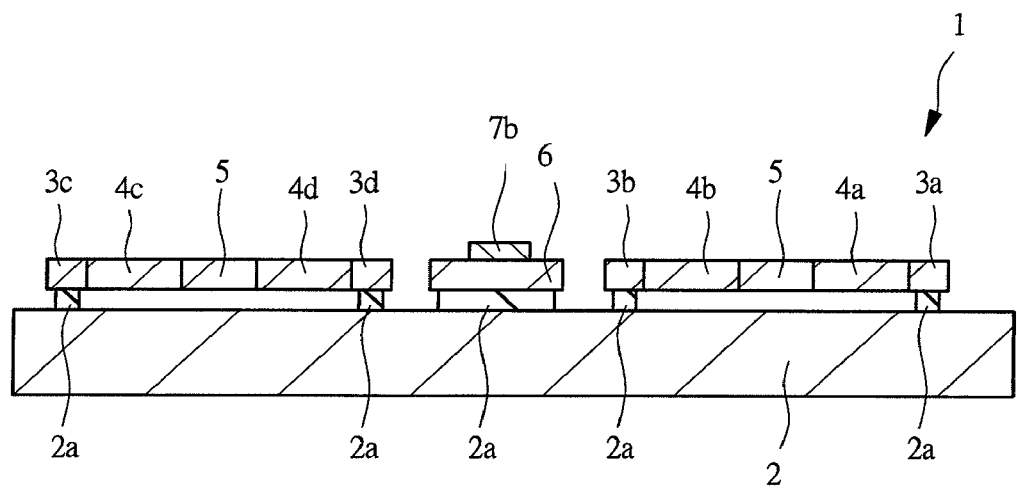
FIG. 6 is a cross-sectional view taken along the line B-B in FIG. 4.

FIG. 6 is a cross-sectional view taken along the line B-B in FIG. 4. As shown in FIG. 6, the fixed portions 3a, 3b, 3c and 3d, the beams 4a, 4b, 4c and 4d, the movable body 5 and the fixed electrode 6 are formed by processing the silicon layer of the SOI substrate. The fixed portions 3a, 3b, 3c and 3d and the fixed electrode 6 are fixed to the semiconductor substrate 2 via the embedded insulating layer 2a. On the other hand, the embedded insulating layer 2a positioned below the beam 4a, 4b, 4c and 4d and the movable body 5 is removed. By this means, the beam 4a, 4b, 4c and 4d and the movable body 5 are structured to float above the semiconductor substrate 2, so that they are displaceable. At this time, the beams 4a, 4b, 4c and 4d are formed to be connected at their one ends to the fixed portions 3a, 3b, 3c and 3d, respectively, and connected at the other ends to the movable body 5. Therefore, the movable body 5 is structured to float above the semiconductor substrate 2 but is supported by the beams 4a, 4b, 4c and 4d.

Note that the sensor element 1 is formed by using the SOI substrate in the first embodiment, but it is not always necessary to use the SOI substrate. For example, the sensor element 1 can also be formed by using a semiconductor substrate obtained by forming an insulating film functioning as a BOX layer on a substrate obtained by sticking silicon and glass together or on a silicon substrate functioning as a substrate layer and then forming a conductive film such as a polysilicon film functioning as an active layer.

Figure 7:
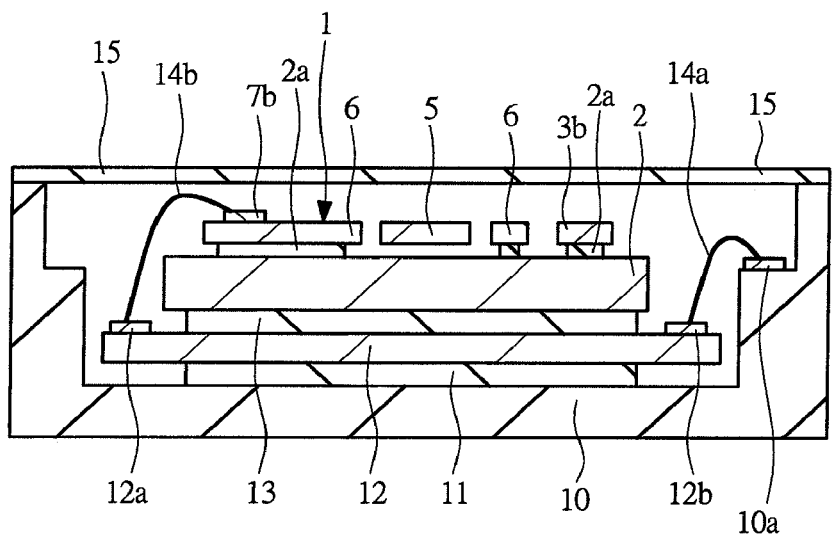
FIG. 7 is a cross-sectional view showing a state where the sensor element of the acceleration sensor according to the first embodiment has been packaged.

The sensor element 1 of the acceleration sensor in the first embodiment has the structure as described above, and the package structure of the sensor element 1 will be described below. FIG. 7 is a cross-sectional view showing the package structure of the sensor element 1. As shown in FIG. 7, a semiconductor chip (second semiconductor chip) 12 on which an integrated circuit is formed is mounted on a bottom surface of an outer frame 10 having a concave portion via an adhesive agent 11, and the sensor element (first semiconductor chip) 1 is mounted on the semiconductor chip 12 via an adhesive agent 13. Then, for example, the pad 7b formed on the fixed electrode 6 of the sensor element 1 and a pad 12a formed on the semiconductor chip 12 are connected to each other by using a wire 14b. Similarly, a pad 12b formed on the semiconductor chip 12 and a pad 10a formed on the outer frame 10 are connected to each other by a wire 14a. By this means, the sensor element 1 and the integrated circuit formed on the semiconductor chip 12 are electrically connected to each other, and further an output signal from the integrated circuit formed on the semiconductor chip 12 can be output externally from the outer frame 10. The sensor element 1 and the semiconductor chip 12 disposed inside the outer frame 10 in this manner are sealed with a cap 15 placed on top of the outer frame 10. In the manner described above, the sensor element 1 can be packaged, and thus an acceleration sensor can be formed.

Subsequently, an operation of the acceleration sensor in the first embodiment will be described. In the first embodiment, mainly, a mass of the movable body 5 shown in FIG. 4 is represented by the symbol m1 in Expression (5) described above, and a total of spring constants of the beams 4a, 4b, 4c and 4d shown in FIG. 4 is represented by the symbol k1 in Expression (5). Here, when an acceleration a1 is applied in a detecting direction (x-direction) of the acceleration sensor (sensor element 1 shown in FIG. 4), the movable body 5 is displaced in the detecting direction. An amount of the displacement is $x1=(m1/k1) \times a1$ from Expression (5) described above. When the displacement x1 is generated, a distance between the movable body 5 and the fixed electrodes 6 is fluctuated, and the electrostatic capacitance between the movable body 5 and the fixed electrode 6 on the left side (see FIG. 4) and the electrostatic capacitance between the movable body 5 and the fixed electrode 6 on the right side (see FIG. 4) change in a decreasing direction and in an increasing direction, respectively. For example, in the case where the movable body 5 is displaced rightward in FIG. 4, the distance between the movable body 5 and the fixed electrode 6 on the left side increases to reduce the electrostatic capacitance, while the distance between the movable body 5 and the fixed electrode on the right side decreases to increase the electrostatic capacitance.

Figure 8:
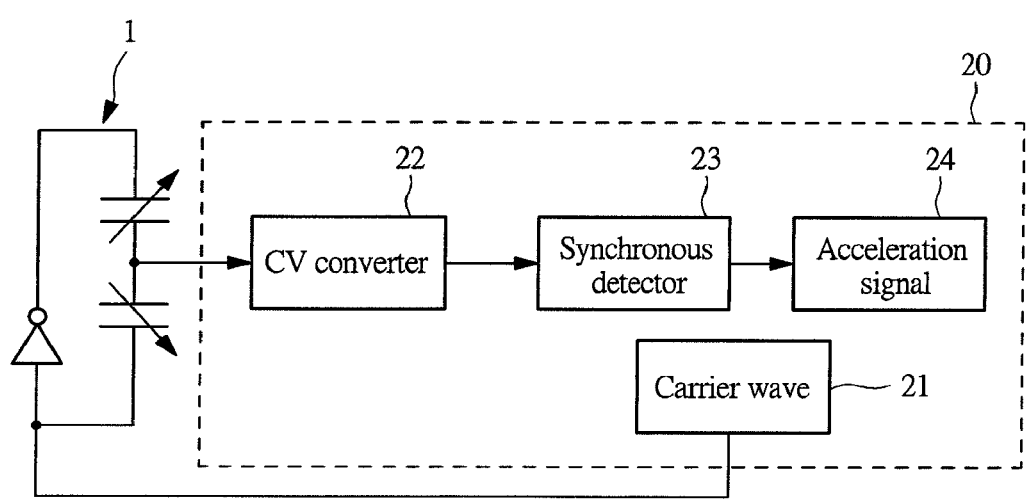
FIG. 8 is a block diagram schematically showing a configuration of acceleration detection of the acceleration sensor according to the first embodiment.

This change in capacitance is output from the sensor element shown in FIG. 7 to the integrated circuit formed on the semiconductor chip 12 that is a sensor control/signal processing IC shown in FIG. 7 and then processed. Specifically, as shown in FIG. 8, a carrier wave 21 for detecting an electrostatic capacitance is applied from an integrated circuit 20 formed on the semiconductor chip 12 (see FIG. 7) to the pad 7b of the fixed electrode 6 shown in FIG. 4. Then, a signal of a capacitance change is output from the pad 7a of the fixed portion 3a joined to the movable body 5 via the beam 4a shown in FIG. 4. That is, as shown in FIG. 8, the signal of the capacitance change from the sensor element 1 is differentially input into a CV converter 22. After the capacitance change is converted into a voltage signal in the CV converter 22, this voltage signal is output to a synchronous detector 23. The synchronous detector 23 extracts only a necessary signal component and outputs an acceleration signal 24 finally in the form of voltage. At this time, since the amount of the displacement x1 of the movably body 5 is proportional to an applied acceleration if the mass m of the movably body 5 and the total of spring constants k of the beams 4a, 4b, 4c and 4d are constant, the applied acceleration can be detected by monitoring the output voltage (acceleration signal) proportional to the amount of the displacement x1. The acceleration sensor in the first embodiment operates in the manner described above.

Figure 9:
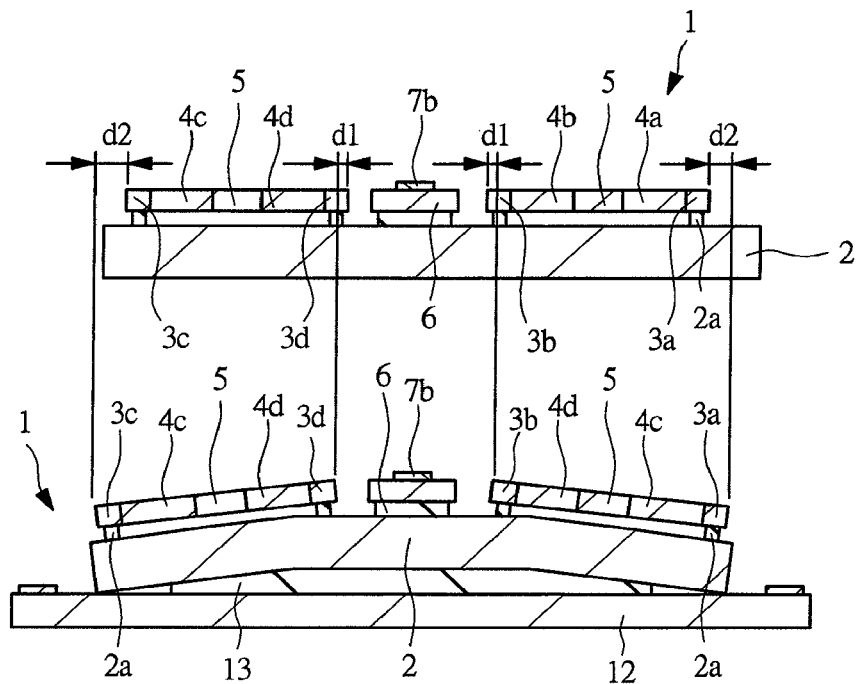
FIG. 9 is a cross-sectional view showing a state where deformation occurs in the semiconductor substrate.

Next, a structure of the first embodiment that suppresses the fluctuation of the natural frequency of the sensor element 1 will be described. FIG. 9 is a diagram showing a structure of connecting the sensor element 1 and the semiconductor chip 12 to each other via the adhesive agent 13 in the packaging of the sensor element 1. First, the adhesive agent 13 is applied in a less viscous state between the semiconductor chip 12 and the sensor element 1. Then, the adhesive agent 13 is heated to setting, thereby adhesively fixing the sensor element 1 and the semiconductor chip 12 to each other. However, since an organic solvent used to reduce the viscosity of the adhesive agent 13 volatilizes at the heating time for setting of the adhesive agent 13, the volume of the adhesive agent 13 changes, which causes deformation of the semiconductor substrate 2 constituting the sensor element 1 (first factor).

Further, the sensor element 1 is composed of, for example, the SOI substrate, and in the SOI substrate, the substrate layer and the silicon layer are made of silicon and the embedded insulating layer is made of a silicon oxide film. Since the silicon and the silicon oxide film are different in coefficient of thermal expansion from each other, stress is applied to the silicon layer from the embedded insulating layer when ambient temperature changes. More specifically, due to the difference in coefficient of thermal expansion between the components (substrate layer, embedded insulating layer, silicon layer) constituting the SOI substrate, the semiconductor substrate 2 constituting the sensor element 1 deforms (second factor).

Due to factors including the first factor and the second factor described above, the semiconductor substrate 2 deforms as shown in FIG. 9. If such deformation as shown in FIG. 9 occurs in the semiconductor substrate 2, the fixed portions 3a to 3d fixed to the semiconductor substrate 2 are displaced. Specifically, the fixed portion 3a and the fixed portion 3c formed near the periphery of the semiconductor substrate 2 are displaced by a distance d2, while the fixed portion 3b and the fixed portion 3d formed near the center of the semiconductor substrate 2 are displaced by a distance d1. At this time, the distance d2 is larger than the distance d1. When the semiconductor substrate 2 deforms in this manner, the fixed portions 3a to 3d are displaced, so that stress acts on the beams 4a to 4d connected to the fixed portions 3a to 3d.

Figure 10:
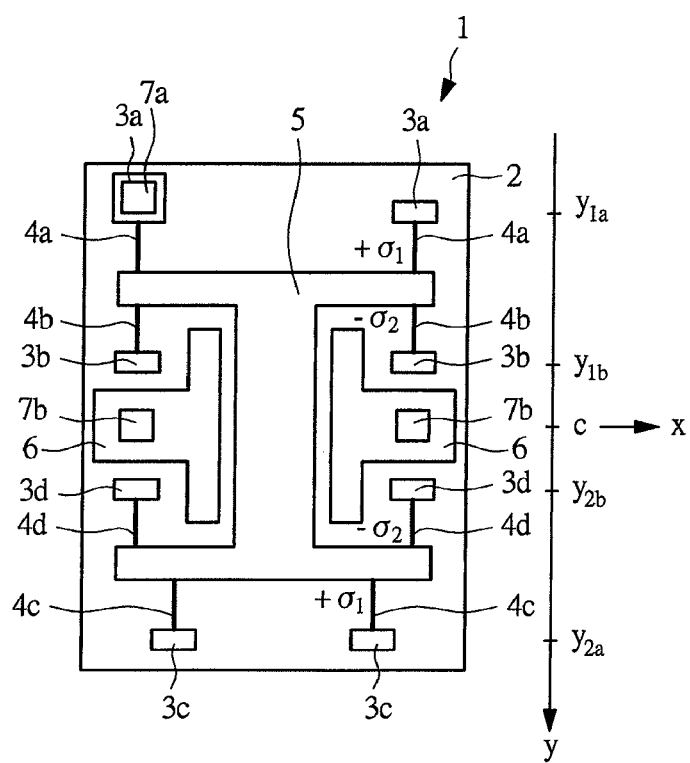
FIG. 10 is a diagram showing a state where a tensile stress acts on the sensor element of the acceleration sensor according to the first embodiment.

The stress acting on the beams 4a to 4d will be described with reference to FIG. 10. FIG. 10 is a diagram showing the stress acting on the beams 4a to 4d when the deformation of the semiconductor substrate 2 shown in FIG. 9 occurs. In FIG. 10, first, the fixed portions 3a to 3d are displaced outward in the y-direction of the semiconductor substrate 2 due to the deformation of the semiconductor substrate 2. More specifically, the fixed potion 3a and the fixed portion 3b are displaced upward on paper (−y direction), while the fixed potion 3c and the fixed portion 3d are displaced downward on paper (+y direction). At this time, since the movable body 5 is disposed so as to float above the semiconductor substrate 2, it is unaffected by the deformation of the semiconductor substrate 2 and is not displaced. Therefore, for example, in terms of a relationship between the fixed portion 3a and the movable body 5, since the fixed portion 3a is displaced upward on paper (−y direction) and the movable body 5 is not displaced, a distance between the fixed portion 3a and the movable body 5 increases. Accordingly, a tensile stress ($+\sigma_1$) is generated in the beam 4a connecting the fixed portion 3a and the movable body 5 to each other, and the spring constant of the beam 4a is increased. On the other hand, for example, in terms of a relationship between the fixed portion 3b and the movable body 5, since the fixed portion 3b is displaced upward on paper (−y direction) and the movable body 5 is not displaced, a distance between the fixed portion 3b and the movable body 5 decreases. Accordingly, a compressive stress ($-\sigma_2$) is generated in the beam 4b connecting the fixed portion 3b and the movable body 5 to each other, and the spring constant of the beam 4b is decreased.

From the foregoing, in terms of a spring system made by combining the beam 4a and the beam 4b, the increase in spring constant caused by the tensile stress acting on the beam 4a and the decrease in spring constant caused by the compressive stress acting on the beam 4b are offset against each other, and thus fluctuation in spring constant of the spring system made by combining the beam 4a and the beam 4b can be suppressed. This point is one of features of the first embodiment. In other words, although the fluctuation in spring constant caused by the individual beam 4a and beam 4b occurs, in terms of the one spring system made by combining the beam 4a and the beam 4b, the fluctuation in spring constant can be reduced.

This is also established between the beam 4c connecting the fixed portion 3c and the movable body 5 and the beam 4d connecting the fixed portion 3d and the movable body 5. That is, in terms of a relationship between the fixed portion 3c and the movable body 5, since the fixed portion 3c is displaced downward on paper (+y direction) and the movable body 5 is not displaced, a distance between the fixed portion 3c and the movable body 5 is increased. Accordingly, a tensile stress ($+\sigma_1$) is generated in the beam 4c connecting the fixed portion 3c and the movable body 5 to each other, and the spring constant of the beam 4c is increased. On the other hand, for example, in terms of a relationship between the fixed portion 3d and the movable body 5, since the fixed portion 3d is displaced downward on paper (+y direction) and the movable body 5 is not displaced, a distance between the fixed portion 3d and the movable body 5 is decreased. Accordingly, a compressive stress ($-\sigma_2$) is generated in the beam 4d connecting the fixed portion 3d and the movable body 5 to each other, and the spring constant of the beam 4d is decreased.

Therefore, in terms of a spring system made by combining the beam 4c and the beam 4d, the increase in spring constant caused by the tensile stress acting on the beam 4c and the decrease in spring constant caused by the compressive stress acting on the beam 4d are offset against each other, and thus fluctuation in spring constant of the spring system made by combining the beam 4c and the beam 4d can be suppressed.

The sensor element 1 in the first embodiment has the structure including two first spring systems made by combining the beam 4 and the beam 4b and two second spring systems made by combining the beam 4c and the beam 4d, and since the respective first spring systems and second spring systems can reduce the fluctuation in spring constant, the fluctuation in spring constant of a combination of all the beams 4a to 4d connecting the movable body 5 and the fixed portions 3a to 3d of the sensor element 1 can be suppressed. Being able to suppress the fluctuation in total spring constant in the sensor element 1 means being able to suppress the fluctuation in natural frequency of the sensor element 1. Therefore, according to the first embodiment, since the fluctuation in natural frequency of the sensor element 1 can be suppressed, the fluctuation in detection sensitivity of the angular velocity sensor and the acceleration sensor can be suppressed, and thus the degradation of the measurement accuracy and the reduction in reliability can be prevented.

The feature of the first embodiment lies in devising the spring system connecting the movable body and the fixed portions. For example, the beam 4a connecting the movable body 5 and the fixed portion 3a and the beam 4b connecting the movable body 5 and the fixed portion 3b constitutes one spring system. In this case, since the spring constant of the beam 4a increases while the spring constant of the beam 4b decreases, the fluctuation in spring constant can be offset and reduced in one spring system made by combining the beam 4a and the beam 4b.

The structure that can offset the fluctuation in spring constant can be achieved by, for example, disposing the fixed portion 3a, the beam 4a, the fixed portion 3b and the beam 4b on the same side with respect to the center line of the sensor element (first semiconductor chip) 1. At this time, for example, when deformation of the semiconductor substrate 2 occurs in a y-axis direction, the center line of the sensor element 1 can be defined as a straight line extending in an x-axis direction (direction of displacement of the movable body 5) through the center (C) in the y-direction. Then, in this case, the beam 4a and the beam 4b are disposed in directions intersecting the center line. On the premise of this structure, further, the most important structure is that a connecting portion of the movable body 5 connected to the beam 4a and the beam 4b is disposed so as to be sandwiched between the beam 4a and the beam 4b. In other words, the beam 4a and the beam 4b are disposed on the opposite sides with respect to the connecting portion of the movable body 5 connected to the beam 4a and the beam 4b.

For example, by disposing the fixed portion 3a and the fixed portion 3b on the same side with respect to the center line, the fixed portion 3a and the fixed portion 3b can be displaced in the same direction (upward on paper, −y direction). By providing the connecting portion of the movable body 5 so as to be sandwiched between the fixed portion 3a and the fixed portion 3b in this state, the structure can be achieved, in which a tensile stress acts on the beam 4a connecting the fixed portion 3a and the movable body 5 and a compressive stress acts on the beam 4b connecting the fixed portion 3b and the movable body 5. In this manner, the spring constant of the beam 4a is increased and the spring constant of the beam 4b is decreased. Therefore, fluctuation in spring constant of the spring system made by combining the beam 4a and the beam 4b can be suppressed.

Figure 11:
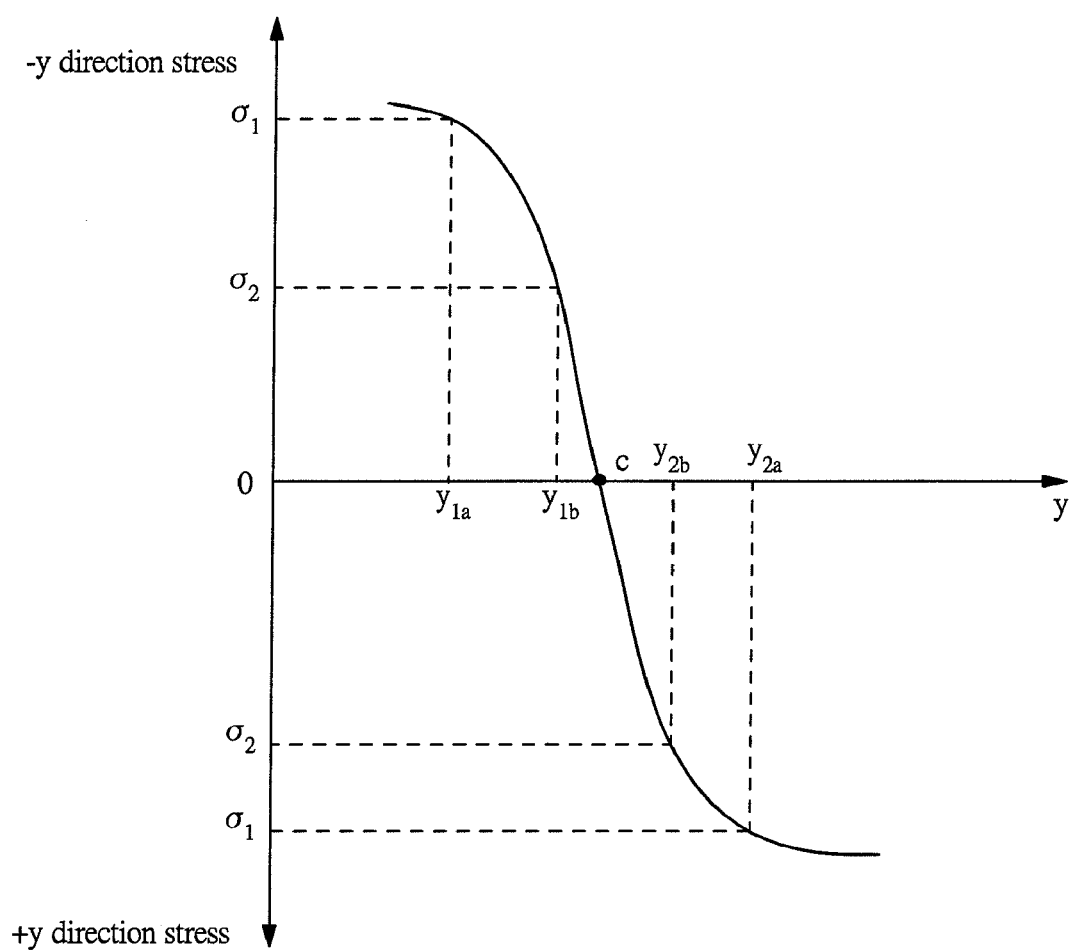
FIG. 11 is a graph showing positions in a y-direction of a semiconductor substrate and stresses acting on the respective positions in the technology described in the first embodiment.

FIG. 11 is a graph showing positions in the y-direction of the semiconductor substrate 2 and stresses acting on the respective positions in the sensor element 1 in the first embodiment. In FIG. 11, a horizontal axis represents a position in the y-direction, and a vertical axis represents a stress. It is found that, in the case where a tensile stress acts on the semiconductor substrate 2, a direction in which the stress acts is reversed at the central position (C) in the y-direction. Therefore, it is found that, in order to cause a stress in the same direction to occur in the fixed portion 3a and the fixed portion 3b constituting one spring system, it is necessary to dispose the fixed portion 3a and the fixed portion 3b on the same side with respect to the central position (C) in the y-direction. For example, in FIG. 11, a symbol $y_{1a}$ represents a location to dispose the fixed portion 3a, and a symbol $y_{1b}$ represents a location to dispose the fixed portion 3b. Therefore, it is found that the fixed portion 3a and the fixed portion 3b are disposed on the same side with respect to the central position (C) in the y-direction. By disposing the connecting portion of the movable body 5 so as to be sandwiched between the fixed portion 3a and the fixed portion 3b in this state, the structure can be achieved in which a tensile stress acts on the beam 4a connecting the fixed portion 3a and the movable body 5 and a compressive stress acts on the beam 4b connecting the fixed portion 3b and the movable body 5. However, since the stress ($\sigma_1$) acting on the beam 4a (which can also be said to act on the fixed portion 3a) and the stress ($\sigma_2$) acting on the beam 4b (which can also be said to act on the fixed portion 3b) are different in magnitude from each other, the tensile stress acting on the beam 4a and the compressive stress acting on the beam 4b cannot be completely offset, but it is certain that at least the fluctuation in spring constant of the spring system made by combining the beam 4a and the beam 4b can be reduced.

Similarly, it is found that, in order to cause a stress in the same direction to occur in the fixed portion 3c and the fixed portion 3d constituting one spring system, it is necessary to dispose the fixed portion 3c and the fixed portion 3d on the same side with respect to the central position (C) in the y-direction. For example, in FIG. 11, a symbol $y_{2a}$ represents a location to dispose the fixed portion 3c, and a symbol $y_{2b}$ represents a location to dispose the fixed portion 3d. Therefore, it is found that the fixed portion 3c and the fixed portion 3d are disposed on the same side with respect to the central position (C) in the y-direction. By disposing the connecting portion of the movable body 5 so as to be sandwiched between the fixed portion 3c and the fixed portion 3d in this state, the structure can be achieved in which a tensile stress acts on the beam 4c connecting the fixed portion 3c and the movable body 5 and a compressive stress acts on the beam 4d connecting the fixed portion 3d and the movable body 5. However, since the stress ($a_1$) acting on the beam 4c (which can also be said to act on the fixed portion 3c) and the stress ($\sigma_2$) acting on the beam 4d (which can also be said to act on the fixed portion 3d) are different in magnitude from each other, the tensile stress acting on the beam 4c and the compressive stress acting on the beam 4d cannot be completely offset, but it is certain that at least the fluctuation in spring constant of the spring system made by combining the beam 4c and the beam 4d can be reduced.

In the sensor element 1 in the first embodiment, as shown in FIG. 10, beams may be disposed so as to be aligned on a straight line like the beam 4a and the beam 4b, or beams may be disposed so as not to be aligned on a straight line like the beam 4c and the beam 4d. In either structure, it is possible to increase the spring constant of one beam and decrease the spring constant of the other beam. Therefore, not only the fluctuation in spring constant of the spring system made by combining the beam 4a and the beam 4b disposed so as to be aligned on a straight line but also the fluctuation in spring constant of the spring system made by combining the beam 4c and the beam 4d disposed so as not to be aligned on a straight line can be suppressed.

The micro electro mechanical system in the first embodiment is an MEMS provided with fixed portions fixed to a substrate, beams extending from the fixed portions and supporting a movable body in a movable state, and the movable body suspended by the beams, and the MEMS has a feature in the structure in which two or more spring systems are provided when the fixed portion and the beam are regarded as one spring system, and the spring systems are formed as a first spring system whose spring constant increases and a second spring system whose spring constant decreases when the respective fixed portions dislocate due to deformation of the substrate or the like. Therefore, the fluctuation in spring constant can be suppressed in one spring set made by combining the first spring system and the second spring system.

The natural frequency of the movable body is a function of the mass of the movable body and the spring constant of the beams suspending the movable body to the substrate. Here, assuming the case where there is no attachment of foreign matter or the like, fluctuation of the mass of the movable body due to temperature and time elapsing can be ignored, and therefore the natural frequency is a function of only the spring constant of the beams. Accordingly, even if the substrate or the movable body deforms due to change in ambient environment such as temperature or time elapsing, the natural frequency is not fluctuated unless the spring constant of the whole oscillating system (spring systems) is fluctuated. Therefore, by using a technical idea in the first embodiment, a robust structure against fluctuation in ambient environment such as mounting distortion and temperature fluctuation can be provided for an angular velocity sensor, an acceleration sensor, a filter, an oscillator and the like whose natural frequency affects their performance.

Further, as another feature, when the first spring system and the second spring system are regarded as one spring set, the one spring set is disposed on the same side in perpendicular directions with respect to the center of a drive axis, the beams extending oppositely from the respective fixed portions are provided, and the same structure is symmetrically constructed on the opposite side of the drive axis. Here, since the first spring system and the second spring system are symmetrically disposed on the same side with respect to the center of the drive axis, the respective fixed portions of the spring systems are displaced in the same direction when the substrate or the movable body deforms due to mounting distortion, temperature fluctuation and the like. Accordingly, for example, when a tensile stress occurs in the first spring system, a compressive stress occurs in the second spring system, and as a result, the fluctuation in spring constant can be suppressed in the one spring set composed of the first spring system and the second spring system.

Second Embodiment

In a second embodiment, an example where fluctuation in spring constant of a whole sensor element can be further suppressed when a stress occurs in a semiconductor substrate will be described.

Figure 12:
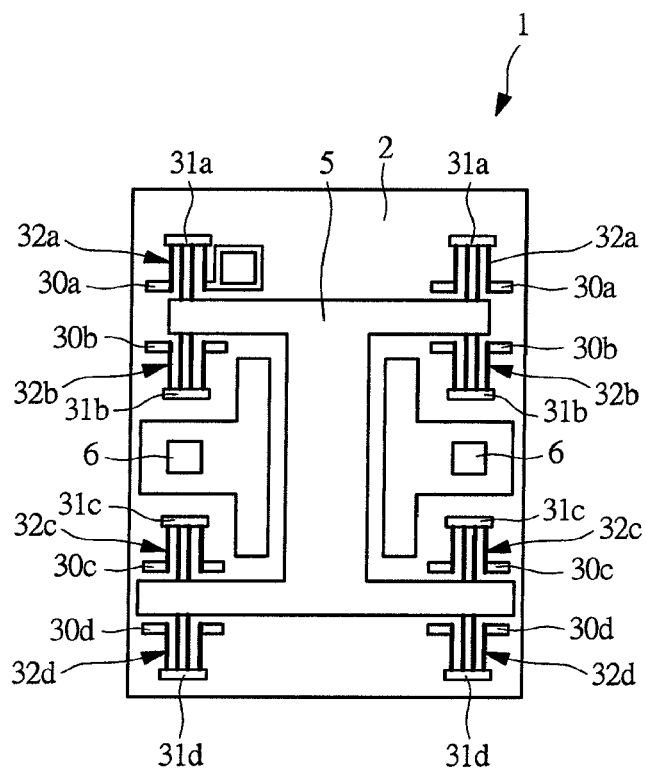
FIG. 12 is a diagram showing a structure of a sensor element of an acceleration sensor according to the second embodiment.

FIG. 12 is a plan view showing a sensor element 1 of an acceleration sensor in the second embodiment. In FIG. 12, a feature of the sensor element 1 in the second embodiment lies in that a turning portion 31a is provided for a beam 32a connecting a fixed portion 30a and a movable portion 5. Similarly, a turning portion 31b is also provided for a beam 32b connecting a fixed portion 30b and the movable portion 5. By this means, the fixed portion 30a and the fixed portion 30b disposed at symmetrical positions with respect to a connecting portion of the movable body 5 can be brought closer to each other. That is, the beam 32a has the turning portion 31a between one end of the beam 32a and the other end of the beam 32a, and the beam 32b has the turning portion 31b between one end of the beam 32b and the other end of the beam 32b.

An advantage obtained by bringing the fixed portion 30a and the fixed portion 30b closer in this manner will be described. For example, as can be seen from FIG. 11, when the fixed portion 30a and the fixed portion 30b are disposed on the same side with respect to the center (C) of the y-axis, stresses in the same direction occur, but if the position of the fixed portion 30a is defined as the position $y_{1a}$ and the position of the fixed portion 30b is defined as the position $y_{1b}$, the stresses become considerably different in magnitude when the position $y_{1a}$ of the fixed portion 30a and the position $y_{1b}$ of the fixed portion 30b are separated from each other. At this time, in the second embodiment, a compressive stress acts on the beam 32a connecting to the fixed portion 30a, and a tensile stress acts on the beam 32b connecting to the fixed portion 30b. Accordingly, a decrease in spring constant of the beam 32a and an increase in spring constant of the beam 32b can be offset against each other, and fluctuation in spring constant of a spring set made by combining a spring system of the beam 32a and a spring system of the beam 32b can be suppressed. However, if a distance between the fixed portion 30a and the fixed portion 30b is large, the magnitude of the compressive stress acting on the beam 32a and the magnitude of the tensile stress acting on the beam 32b are considerably different from each other, and therefore the compressive stress and the tensile stress cannot be completely offset against each other. More specifically, ideally, it is desired that the magnitude of the compressive stress acting on the beam 32a and the magnitude of the tensile stress acting on the beam 32b become equal to each other. For its achievement, as can be seen from FIG. 11, it is desired that the distance between the fixed portion 30a and the fixed portion 30b is reduced.

Therefore, in the second embodiment, as shown in FIG. 12, the distance between the fixed portion 30a and the fixed portion 30b is reduced. In order to reduce the distance between the fixed portion 30a and the fixed portion 30b, it is necessary to devise the arrangement of the beam 32a and the beam 32b, and for example, the reduction in distance is achieved by providing the turning portion 31a for the beam 32a. The above structure is applied to all of the fixed portions and the beams constituting the sensor element 1. For example, a turning portion 31c is provided for a beam 32c connecting a fixed portion 30c and the movable body 5. Similarly, a turning portion 31d is provided for a beam 32d connecting a fixed portion 30d and the movable body 5.

In this manner, in the sensor element 1 in the second embodiment, by providing the turning portions 31a to 31d for the beams 32a to 32d, the fixed portion 30a and the fixed portion 30b or the fixed portion 30c and the fixed portion 30d are brought closer to each other. This is because, when the distance between the fixed portions is large, position fluctuation amounts of the respective fixed portions are different from each other, so that internal stresses occurring in the beams are also different in magnitude. More specifically, when the distance between the fixed portions is large, for example, the spring constant of the spring set made by combining the spring system composed of the beam 32a and the spring system composed of the beam 32b is not completely offset and remains partially. Therefore, in the second embodiment, by turning back the beams, the fixed portions are disposed as close to each other as possible. At this time, for example, the distance between the fixed portion 30a and the fixed portion 30b is smaller than the distance between the turning portion 31a and the turning portion 31b.

A feature of the sensor element 1 in the second embodiment lies in reducing a space between the fixed portion of the first spring system and the fixed portion of the second spring portion. The substrate deforms into an undulated shape with a certain curvature due to mounting distortion and temperature fluctuation. Accordingly, the amounts of displacement of the respective fixed portions increase in inverse proportion to the radius of curvature and in proportion to the distance from the center of driving. Therefore, if the fixed portion of the first spring system and the fixed portion of the second spring system are largely separated from each other, a difference occurs in amount of displacement between the respective fixed portions, and a difference also occurs in absolute value of amount of change in spring constant therebetween. Therefore, in the second embodiment, since the space between the fixed portion of the first spring system and the fixed portion of the second spring system is made as small as possible, the absolute values of amount of fluctuation in spring constant of the first spring system and the second spring system can be approximately equalized. Accordingly, the fluctuation in natural frequency can be suppressed more effectively.

Here, by turning back both the beam of the first spring system and the beam of the second spring system, the space between the fixed portions thereof is made small. That is, by turning back the beam of the first spring system and the beam of the second spring system, the distance between the fixed portions thereof can be easily made small.

Subsequently, a modified embodiment of the second embodiment will be described. The second embodiment shown in FIG. 12 shows an example where the two fixed portions 30a are provided and the beam 32a is formed between the two fixed portions 30a. On the other hand, as the modified embodiment, an example where the one fixed portion 30a is provided and a plurality of beams are disposed so as to surround the one fixed portion 30a will be described.

Figure 13:
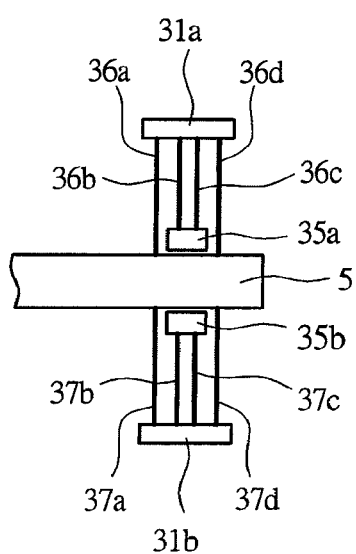
FIG. 13 is a diagram showing a region where the beams in FIG. 12 are formed in an enlarged manner.

FIG. 13 is a diagram showing a region of forming beams 36a to 36d connecting the movable body 5 and a fixed portion 35a and a region of forming beams 37a to 37d connecting the movable body 5 and a fixed portion 35b in an enlarged manner. As shown FIG. 13, the connection between the movable body 5 and the fixed portion 35a is made by the four beams 36a to 36d, and similarly the connection between the movable body 5 and the fixed portion 35b is made by the four beams 37a to 37d. Here, the outside two beams 36a and 36d are joined to the movable body 5, and the inside two beams 36b and 36c are connected to the fixed portion 35a. The beams 36a to 36d are formed so as to be connected through the turning portion 31a. In FIG. 13, the two beams 36b and 36c are connected to the fixed portion 35a, but the number of beams is not necessarily two, and it may be one or plural in number.

Since the movable body 5 and the fixed portion 35a are connected to each other by the plurality of beams 36a to 36d as shown in FIG. 13, the beams 36a to 36d themselves hardly rotate even if the fixed portion 35a is displaced due to deformation occurring in the semiconductor substrate, and therefore the fluctuation in spring constant can be offset more effectively.

Figure 14:
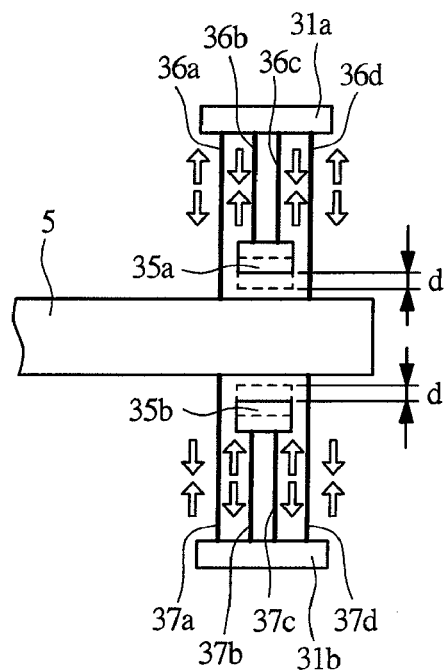
FIG. 14 is a diagram showing tensile stresses and compressive stresses acting on the beams shown in FIG. 13 when fixed portions are displaced.

FIG. 14 is a schematic diagram showing the case where a substrate deformation occurs in the beam structure described with reference to FIG. 13 and positional fluctuations (d) of the fixed portions 35a and 35b occur in directions away from the center of driving. As shown in FIG. 14, due to the positional fluctuations of the fixed portions 35a and 35b, tensile stresses occur in the beams 36a, 36d, 37b and 37c, and compressive stresses occur in the beams 36b, 36c, 37a and 37d. Here, since the four beams are adopted, the tensile stresses occurring in the beam 36a and 36d are offset by the compressive stresses occurring in the beams 36b and 36c of the same spring system. Therefore, theoretically, by adjusting the lengths and widths of the beams 36a to 36d properly, the fluctuation in spring constant of the spring system can be suppressed without the symmetrical structure as described in the present invention. However, the suppression cannot be ideally achieved in the case where processing deviation occurs when a silicon layer of an SOI substrate is processed, the case where the movable body 5 deforms due to positional fluctuations of the fixed portions 35a and 35b and the like.

Therefore, in the modified embodiment, by providing another spring system (the fixed portion 35b, the beams 37a to 37d) as shown in FIG. 14, the tensile stresses occurring in the beams 36a and 36d are offset by the compressive stresses occurring in the beams 37a and 37d disposed symmetrically. Similarly, the compressive stresses occurring in the beams 36b and 36c are offset by the tensile stresses occurring in the beams 37b and 37c. At this time, since the beams 36a and 36d and the beams 37a and 37d, and the beams 36b and 36c and the beams 37b and 37c have approximately the same ambient environments such as the processing condition and the amount of displacement of the fixed portion, stresses whose absolute values are approximately the same but opposite in sign to each other occur. Therefore, a change in total stress of one spring set made by combining a first spring system (the fixed portion 35a, the beams 36a to 36d) and a second spring system (the fixed portion 35b, the beams 37a to 37d) becomes approximately zero, so that the fluctuation in spring constant can be suppressed. More specifically, by making the number of beams 36a to 36d constituting the first spring system equal to the number of beams 37a to 37d constituting the second spring system, the stresses are offset between the individual beams, and the change in total stress of the one spring set made by combining the first spring system and the second spring system can be reduced. As a result, the fluctuation in spring constant of the sensor element can be suppressed.

Third Embodiment

In a third embodiment, an example where fluctuation in spring constant of a whole sensor element can be further suppressed when a stress occurs in a semiconductor substrate will be described.

Figure 15:
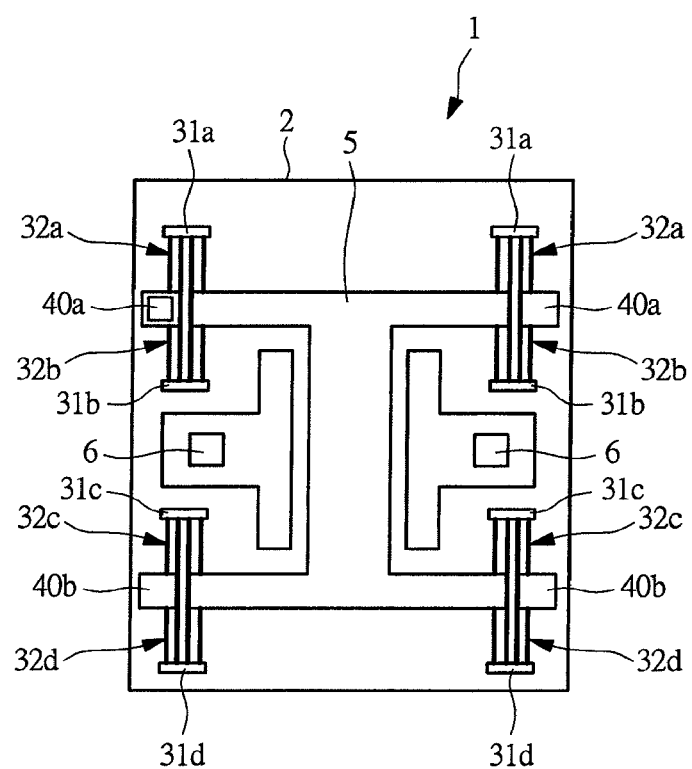
FIG. 15 is a diagram showing a structure of a sensor element of an acceleration sensor according to the third embodiment.

FIG. 15 is a plan view showing a sensor element 1 of an acceleration sensor of the third embodiment. In FIG. 15, a feature of the sensor element 1 in the third embodiment lies in that a fixed portion connected to the beam 32a and a fixed portion connected to the beam 32b are formed as a common fixed portion 40a. Similarly, a fixed portion connected to the beam 32c and a fixed portion connected to the beam 32d are formed as a common fixed portion 40b.

For example, when the fixed portion connected to the beam 32a and the fixed portion connected to the beam 32b are formed separately, a certain distance inevitably exists between the fixed portion connected to the beam 32a and the fixed portion connected to the beam 32b. If the fixed portion connected to the beam 32a and the fixed portion connected to the beam 32b are separated from each other like this, the magnitude of the compressive stress acting on the beam 32a and the magnitude of the tensile stress acting on the beam 32b are significantly different, and therefore the compressive stress and the tensile stress cannot be completely offset. That is, ideally, it is desired that the magnitude of the compressive stress acting on the beam 32a and the magnitude of the tensile stress acting on the beam 32b become equal to each other. This can be achieved by forming the fixed portion connected to the beam 32a and the fixed portion connected to the beam 32b as a common fixed portion. By adopting the common fixed portion, the fixed portion connected to the beam 32a and the fixed portion connected to the beam 32b coincide with each other, and therefore the magnitude of the compressive stress acting on the beam 32a and the magnitude of the tensile stress acting on the beam 32b can be made equal to each other. As a result, a change in total stress of one spring set made by combining the first spring system (the fixed portion 40a, the beam 32a) and the second spring system (the fixed portion 40a, the beam 32b) can be made approximately zero. As a result, the fluctuation in spring constant of the sensor element can be suppressed to a minimum.

As described above, according to the technical idea of the present invention, even if stress/distortion occurs due to adhesion of the sensor element to the package or the structure of the sensor element alone, the fluctuation in natural frequency can be reduced. By this means, high-performance and high-reliable angular velocity sensor and acceleration sensor can be provided. Furthermore, since robustness against mounting distortion and temperature fluctuation can be achieved, adjustment work before shipment becomes easy. Therefore, it can be expected that the present invention can contribute to cost reduction.

In the foregoing, the invention made by the inventors of the present invention has been concretely described based on the embodiments. However, it is needless to say that the present invention is not limited to the foregoing embodiments and various modifications and alterations can be made within the scope of the present invention.

Although the acceleration sensor has been taken as an example to describe the first to third embodiments, the present invention can be applied to an MEMS having a structure in which a movable body is supported by beams such as an angular velocity sensor other than the acceleration sensor, and a remarkable advantage that fluctuation in natural frequency of the MEMS is reduced can be achieved.

INDUSTRIAL APPLICABILITY

The present invention can be widely utilized in a manufacturing industry for manufacturing a micro electro mechanical system.

What is claimed is:

1. A micro electro mechanical system, comprising:
   a sensor element, comprising:
   a first spring system including a first fixed portion and a first elastically-deformable beam connected to the first fixed portion and extending therefrom in a first direction,
   a second spring system including a second fixed portion and a second elastically-deformable beam connected to the second fixed portion and extending therefrom in a second direction opposite to the first direction,
   a third spring system including a third fixed portion and a third elastically-deformable beam connected to the third fixed portion and extending therefrom in a third direction,
   a fourth spring system including a fourth fixed portion and a fourth elastically-deformable beam connected to the fourth fixed portion and extending therefrom in a fourth direction opposite to the third direction, and
   a movable body, movable in a moving direction, suspended from the first fixed portion via the first beam, suspended from the second fixed portion via the second beam, suspended from the third fixed portion via the third beam, and suspended from the fourth fixed portion via the fourth beam,
   wherein the first and second spring systems are arranged on one side of a virtual line extending in the moving direction through a center of the sensor element, the third and fourth spring systems are arranged on the other side of the virtual line, and, when the movable body is displaced in the moving direction, tensile stresses are generated within the first, second, third and fourth spring systems at the same time.

2. The micro electro mechanical system according to claim 1,
wherein the first and the second fixed portions are the same, and
wherein the third and the fourth fixed portions are the same.

3. The micro electro mechanical system according to claim 1,
wherein the first beam suspends the movable body via a first turning portion,
wherein the second beam suspends the movable body via a second turning portion,
wherein the third beam suspends the movable body via a third turning portion, and
wherein the fourth beam suspends the movable body via a fourth turning portion.

4. The micro electro mechanical system according to claim 3,
wherein a distance between the first and the second fixed portions is smaller than a distance between the first and the second turning portions, and
wherein a distance between the third and the fourth fixed portions is smaller than a distance between the third and the fourth turning portions.

5. The micro electro mechanical system according to claim 1,
wherein the first beam is in alignment with the second beam, and
wherein the third beam is in alignment with the fourth beam.

6. The micro electro mechanical system according to claim 1,
wherein the first and the second spring systems are symmetric with respect to the virtual line, and
wherein the third and the fourth spring system are symmetric with respect to the virtual line.

7. The micro electro mechanical system according to claim 1,
wherein each of the first, second, third and fourth beams include a number of beams.

8. The micro electro mechanical system according to claim 7,
wherein the number of first beams is the same as the number of second beams, and
wherein the number of third beams is the same as the number of fourth beams.

9. The micro electro mechanical system according to claim 1,
wherein the first, second, third and fourth fixed portions, the first, second, third and fourth beams, and the movable body are arranged on a first semiconductor chip, and
wherein the first semiconductor chip is mounted on an underlayer substrate via an adhesive agent.

10. The micro electro mechanical system according to claim 9,
wherein the underlayer substrate is a second semiconductor chip on which an integrated circuit is formed.

11. The micro electro mechanical system according to claim 1,
wherein the sensor element is an angular velocity sensor.

12. The micro electro mechanical system according to claim 2,
wherein the first, second, third and fourth fixed portions are fixed to a semiconductor substrate that is deformable in a direction perpendicular to the moving direction, and
wherein the center of the sensor element is located at a stress inflection point along the direction perpendicular to the moving direction.

13. The micro electro mechanical system according to claim 12,
wherein the stress inflection point is a zero stress point.

14. The micro electro mechanical system according to claim 1,
wherein the first, second, third and fourth elastically-deformable beams are arranged perpendicular to the moving direction.

* * * * *